United States Patent [19]

Gerosa et al.

[11] Patent Number: 4,992,676
[45] Date of Patent: Feb. 12, 1991

[54] OUTPUT BUFFER HAVING DISTRIBUTED STAGES TO REDUCE SWITCHING NOISE

[75] Inventors: Gianfranco Gerosa; Rene M. Delgado, both of Austin, Tex.; Carl L. Shurboff, Chandler, Ariz.

[73] Assignee: Motorola, Inc., Schaumburg, Ill.

[21] Appl. No.: 345,735

[22] Filed: May 1, 1989

[51] Int. Cl.[5] .................. H03K 17/16; H03K 19/003; H03K 5/13; H03K 5/159

[52] U.S. Cl. ..................... 307/443; 307/451; 307/594; 307/601; 307/263

[58] Field of Search ............ 307/594, 585, 296.8, 307/451, 443, 448, 542, 263, 601; 377/122

[56] References Cited

U.S. PATENT DOCUMENTS

| | | | |
|---|---|---|---|
| 3,603,810 | 9/1971 | Clayson | 377/122 |
| 4,612,466 | 9/1986 | Stewart | 307/451 |
| 4,725,747 | 2/1988 | Stein | 307/594 |
| 4,785,203 | 11/1988 | Nakamura | 307/451 |
| 4,789,793 | 12/1988 | Ehni | 307/594 |
| 4,806,794 | 2/1989 | Walters, Jr. | 307/451 |
| 4,882,505 | 11/1989 | Furman | 377/122 |
| 4,885,485 | 12/1989 | Leake et al. | 307/451 |

Primary Examiner—Stanley D. Miller
Assistant Examiner—Toan Tran
Attorney, Agent, or Firm—Robert S. Babayi

[57] ABSTRACT

An output buffer integrated circuit, including an output signal, is provided having an improved Vdd and Vss noise characteristics. The output buffer comprise a plurality of pull-up stages and pull-down stages functioning as complementary pairs. The pull-up stage pulls the output signal to the Vdd potential, and the pull-down stages pulls the output to the Vss potential. Each stage provides a pulling signal to turn on a pulling transistor in response to the pulling signal of the previous stage. The first pulling stage provides the pulling signal in response to the input signal. Each stage sequentially pulls the output signal within a substantially constant time. The constant time delay within each stage is provided by sizing the width of the active elements on the integrated circuit. The pulling stages turn off the pulling transistors instantaneously in response to the invert of the input signal.

8 Claims, 1 Drawing Sheet

4,992,676

OUTPUT BUFFER HAVING DISTRIBUTED STAGES TO REDUCE SWITCHING NOISE

TECHNICAL FIELD

This invention relates generally to the field of CMOS integrated circuits. In particular the present invention relates to CMOS output buffer circuits.

BACKGROUND ART

Digital logic, in the form of integrated circuits, has found wide spread use in virtually every type of electronic system. Currently, some integrated circuits combine analog and digital devices in one package, in order to reduce the overall size of the electronic systems. The interface function is a basic function, which allows the logic of one integrated circuit device to interface with other devices within the package or outside. One important component for this interface function is the output buffer which, when enabled, provides an output which is a function of data received from other logic circuitry of the integrated circuit.

CMOS output buffers typically use a P-channel pull-up FET and a N-channel pull down FET connected to the output terminal. Depending upon the state of the data signal input, either the P-channel FET or the N-channel FET is turned on. A tri-state output buffer may be provided by turning off both the N-channel FET and the P-channel FET.

Advancement in integrated circuit technology has lead to vast improvements in the speed of integrated circuits, i.e. the time in which the output of a circuit reacts in response to a new input. Increasing integrated circuit speed has resulted in faster rise and fall times of the output voltages. Similarly, the fast rise and fall times of the output voltages have resulted in abrupt transitions of output current.

While faster speeds are very desirable, the abrupt transition of output currents creates serious problems. The package which holds an integrated circuit device has metallic leads which allow interconnection of the device to a circuit board. Each lead has a small inductance associated with it. The leads are connected to the integrated circuit using bonding wire, which also has an inductance. The time rate of change of current is governed by the equation $E = L(di/dt)$, where L is the measure of inductance, and di/dt is the change in current with respect to time. The abrupt transition of output currents creates a large change of current at the ground and power supply leads and in the bonding wire, resulting in ground and power supply voltage spikes. These voltage spikes affect the output voltages of the device, and cause output ringing, ground bounce, and false signals.

Systems have been developed which attempt to alleviate this problem by reducing the amount of inductance L present at the leads. One method provides multiple power supply and ground leads in order to reduce the inductance L that generates the voltage spikes. However, the reduction in inductance is often insufficient to eliminate voltage spikes at the output of many devices, and may necessitate using a larger package to carry the same integrated circuit.

Another method is described by Stein et al in the U.S. Pat. No. 4,725,747, wherein change in current with respect to time (di/dt) is reduced. Stein et al. uses a plurality of CMOS complimentary pairs stages, each having a P-channel transistor and an N-channel transistor, connected by a serpentine polysilicon gate. The stages are sequentially turned on, within a delay period, in response to a changing input. The amount of delay for each stage depends on the absolute resistance of the polysilicon gate and the input capacitance of each transistor. However, since it is difficult to control the absolute resistance of the polysilicone gate in a standard CMOS process technology, the turn on delay in each stage may vary. Therefore, in designs of output buffers using this method undesirable varaition in access time may be encountered.

SUMMARY OF THE INVENTION

Accordingly, it is an object of the present invention to provide an output buffer, which substantially reduces the switching noise in high speed integrated circuits by providing controlled predetermined delay for output changes.

Briefly, according to the invention, an output buffer is provided having a plurality of pull-up stages coupled in parallel to an output signal. Similarly, a plurality of pull-down stages are coupled in parallel to the output signal. The pull-up and pull-down stages are coupled to a first and second input signals respectively, and function as complementary pairs. The first and second signals may be coupled to each other if a dual state output buffer is desired.

Each pull-up stage comprise a pull-up transistor to bring the output signal to a Vdd potential, when turned on by a pull-up signal. The first pull-up stage also includes an inverter and provides a quick pull-up signal to turn on a first pull-up transistor in response to the first input signal. Each subsequent pull-up stages comprise means for providing a delayed pull-up signal to turn on subsequent pull-up transistors in response to the pull-up signal of the previous stage. Each pull-up stage also includes means to quickly turn off the pull-up transistor in response to invert of the first input signal. Similarly, each pull-down stage comprise a pull-down transistor to bring the output signal to a Vss potential when turned on by a pull-down signal. The first pull-down stage includes an inverter and provides a quick pull-down signal to turn on a first pull-down transistor in response to the second input signal. Each subsequent pull-down stages comprise means for providing a delayed pull-down signal to turn on subsequent pull-down transistors in response to the pull-down signal of the previous stage. Each pull-down stage also includes means to quickly turn off the pull-down transistor in response to invert of the second input signal.

DETAILED DESCRIPTION OF THE PREFERRED EMBODIMENT

Figure 1:
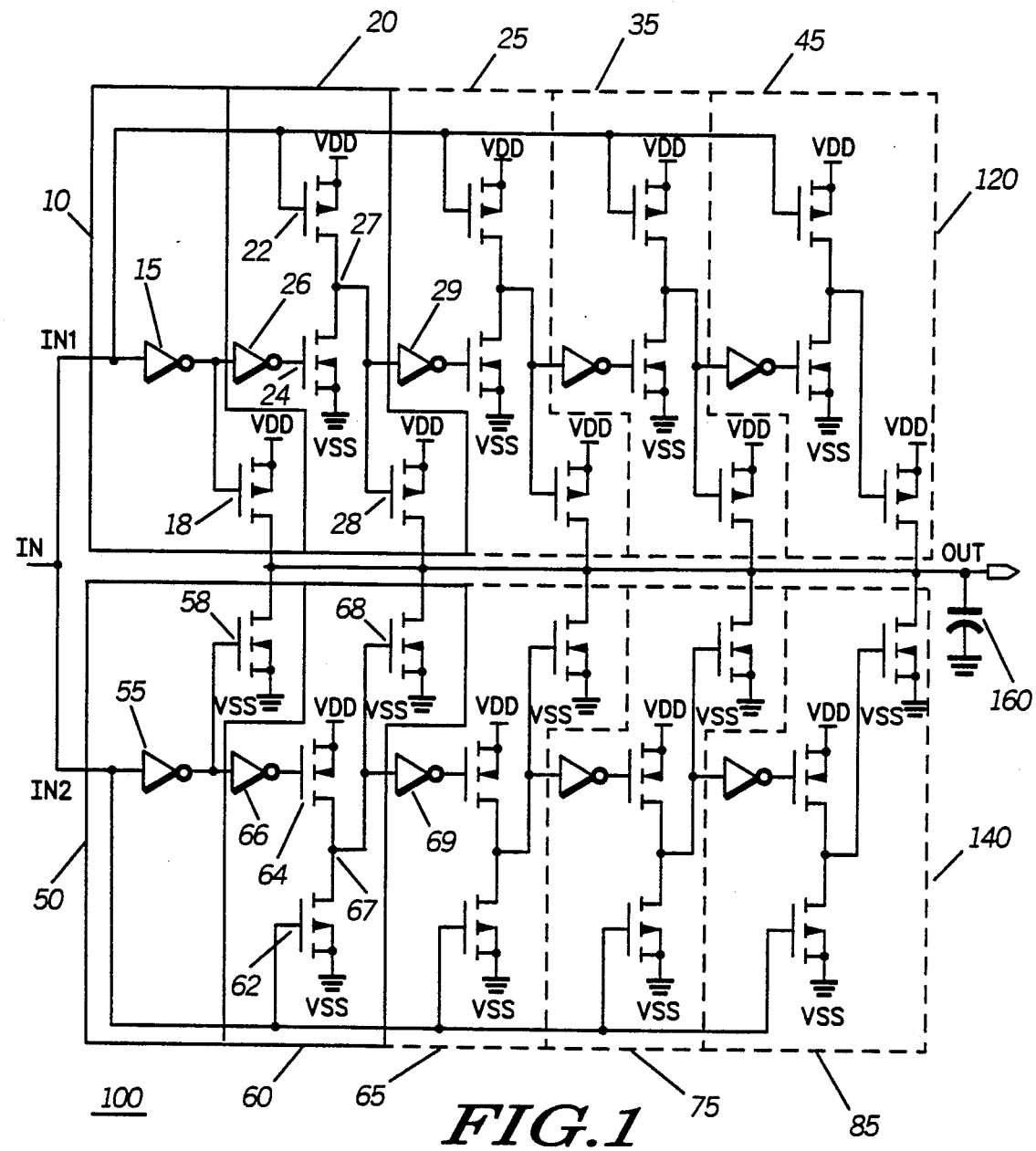
FIG. 1 is a schematic diagram of an output buffer according to the present invention.

Referring to FIG. 1, an output buffer 100 having an output signal OUT is shown. The output buffer 100 comprise a pull-up section 120 and a pull-down section 140. The pull-up section includes pull-up stages 10, 20, 25, 35 and 45, and the pull-down section includes pull-down stages 50, 60, 65, 75, and 85. An input signal IN is branched into a first input signals IN1 and a second input signal IN2, which are coupled to inverters 15 and 55 respectively. As it is known in the art, the first input signal IN1, and second input signal IN 2 may be independently applied to the pull-up section and pull-down section, in order to provide a tri-state output buffer if desired. The output of inverter 15 is coupled to the gate of a pull-up P-channel enhancement mode field effect transistor (FET) 18, and the output of inverter 55 is coupled to the gate of a pull-down enhancement mode N-channel FET 58. The source of FET 18 and the drain of FET 58 are coupled to the output signal OUT. The FET 18 and FET 58 function as complementary pairs in order to pull the output signal OUT to a Vdd potential or a Vss potential in response to the input signal IN. In the preferred embodiment of the invention the Vdd is a +5 v potential, and the Vss is a ground potential. The output signal OUT is pulled to the Vdd potential when the pull-up FET 18 is turned on, and to the Vss potential when the pull-down FET 58 is turned on.

The output of inverter 15 is also coupled to the input of an inverter 26 in the pull-up stage 20. The output of inverter 26 is coupled to the gate of an N-channel FET 24. The inverter 26 and the N-channel FET 24 in combination have a predetermined propagation delay and provide a pull-up signal at a junction 27, which is coupled to the gate of a pull-up P-channel FET 28 having its source coupled to the output signal OUT. A quick turn-off P-channel FET 22 having its source and drain coupled between the Vdd and the junction 27 is controlled by the first input signal IN1. The pull-up signal at junction 27 is applied to the inverter 29 of subsequent pull-up stage 25. Subsequent pull-up stages 25, 35 and 45 have circuitry identical to the circuit described in the pull-up stage 20.

Similarly, the output of inverter 55 is also coupled to the input of an inverter 66 in the pull-down stage 60. The output of inverter 66 is coupled to the gate of an P-channel FET 64. The inverter 66 and the P-channel FET 64 in combination have a predetermined propagation delay and provide a pull-down signal at a junction 67, which is coupled to the gate of a pull-down N-channel FET 68 having its drain coupled to the output signal OUT. A quick turn-off N-channel FET 62 having its source and drain coupled between the Vss and the junction 67 is controlled by the second input signal IN2. The pull-down signal at junction 67 is applied to the inverter 69 of subsequent pull-down stage 65. Subsequent pull-up stages 65, 75 and 85 have circuitry identical to the circuit described in the pull up stage 60.

Figure 2:
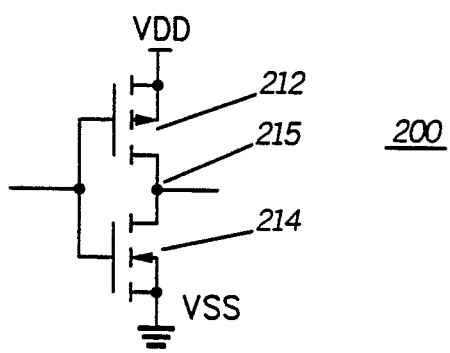
FIG. 2 is a schematic diagram of an inverter utilized by the output buffer of present invention.

The inverters utilized in the preferred embodiment of the invention are known complimentary pair inverters. Referring to FIG. 2, a schematic diagram of one such inverter 200, which comprises a P-channel FET 212, and an N-channel FET 214 is shown. The input of the inverter 200 is provided by coupling the gates of the FETs 212 and 214, and the output of the inverter is provided at the junction 215. The junction 215 is provided by coupling the drain of the P-channel 212 and the drain of the N-channel 214. The Vdd (+5 v) is coupled to source of the P-channel 212, and Vss (ground) is coupled to the source of N-channel FET 214. The operation of the inverter 200 is well known in the art.

In the preferred embodiment of the invention, the output buffer 100 is fabricated using enhancement mode CMOS technology. It is known that sizing of the P-channel FET 212 and N-channel FET 214 determines the transition slope of the inverter 200. The sizing of a P-channel FET, and an N-channel FET is a function of their corresponding substrate width (not shown), and the length of the gate (not shown). Since the length of the gate is the same for P-channel and N-channel FETs in a standard digital CMOS technology, sizing is proportional to the width of the N-channel substrate and the P-channel substrate.

The operation of output buffer 100 of FIG. 1 may be understood by the following example. For the purpose of discussion, a logic 1 is a signal having a +5 v potential (Vdd), and logic 0 is a signal having a ground potential (Vss). We assume the output buffer is driving a capacitor 160 representing a load capacitance of 100 picofarad, and further the input signal IN has reached from a logic 0 to a logic 1. The inverters 15 and 55 present a logic 0 at the gate of pull-up P-channel FET 18 and pull-down FET 58. Since the pull-up FET 18 is turned on and pull-down FET 58 is turned off the output signal OUT will start to rise to the Vdd potential (logic 1) from the Vss potential (logic 0). The logic 1 level on the P-channel FET 22 quickly turns it off. The P-channel FET 22 in pull-up stage 20 and the similar FETs in the subsequent stages 25, 35, and 45 will turned off substantially instantaneous. The output of the inverter 26 is coupled to input of stage 20 at the inverter 26, which after a predetermined delay, provides a logic 1 to the gate of the N-channel FET 24. It is known in the art that the predetermined propagation dely within the inverter is a function of the sizing of the P-channel and N-channel FETs within it. The logic 1 at the at the gate of the N-channel FET 24 turns it on, and provides a logic 0 at the gate of The pull-up P-channel FET 28. The pull-up FET 28 is turned on after an additional predetermined delay. It is also known that this additional delay is a function of the sizing of the N-channel FET 24 and P-channel FET 28. Therefore the total delay provided by stage 20 is the function of the sizing of FETs within it, which, can be controlled by providing desired width for FETs. The pull-up stages 25, 35, and 45 operate in an identical manner and provide a delayed pull-up signal in response to the pull-up signal of the previous stage. Therefore the pull-up stages 10, 20, 25, 35, and 45 sequentially pull-up the output signal OUT to the Vdd potential.

Concurrent with the operation of the pull-up section 120, the pull down section 140 operates in a complementary mode. The logic 1 level on the gate quickly turns on the N-channel FET 62 in the pull-down stage 60 and the similar N-channel FETs in the subsequent stages 25, 35, and 45. Subsequently, the pull-down FET 68 is turned off, before the pull-up FET 28 is turned on. Turning off the pull-down FET 68 before turn on of the pull-up transistor 28 minimizes the race condition between the pull-up FET 28 and the pull-down FET 68, and optimizes the power efficiency of the circuit. The quick turn off of the pull-down stage is repeated simultaneously through subsequent pull-down stages 65, 75, and 85.

A person of ordinary skill in the art may understand the operation of the output buffer 100, when a logic 0 is applied as the input signal IN by following the steps as described when a logic 1 is applied. The complimentary pair function of the pull-up and pull-down stages of the present invention with each stage providing a delay, where the delay is a function of the sizing of the FETs, gives significant advantage in controlling the switching noise on the Vdd and Vss lines. This is because, the sizing may be controlled, so that each stage provides a substantially identical propagation delay. Therefore, the number of pull-up and pull-down stages may be varied to achieve a desired switching noise performance. In the preferred embodiment of the invention, a propagation delay of 1.5 nanosecond is provided by each stage. Furthermore, as faster output buffers becomes available, the switching noise performance may be maintained by simply increasing the number of stages. Also in implementing the output buffer 100 of the invention, other technologies such as bipolar and BIMOS may be used without deviating from the scope of the invention.

What is claimed is:

1. A circuit for producing an output signal, comprising:
   a first inverter stage for inverting a first input signal and providing a pull-up output being coupled to an input of the first of a plurality of subsequent pull-up stages; each of said pull-up stages including:
   a delayed pull-up means comprising integral transistors for receiving a pull-up input from the previous stage and for providing a delayed pull-up output to the subsequent pull-up stage: wherein delay time for providing said delayed pull-up output depends upon the sizing of said transistors:
   a pull-up means being responsive to the delayed pull-up output for pulling-up said output signal to a first supply potential when turned on, and
   a second inverter stage for inverting a second input signal for receiving a pull-down input from the previous stage and for providing a delayed pull-down output to the subsequent pull-down stage; wherein delay time for providing said delayed pull-down output depends upon the sizing of said transistors;
   a pull-down means being responsive to the delayed pull-down output for pulling-down said output signal to a first supply potential when turned on, 2. The circuit of claim 1, wherein said first and second input signals are coupled together.

3. The circuit of claim 1, wherein said delayed pull-up means and said delayed pull-down means include FETs.

4. The circuit of claim 1, wherein said pull-up means comprises a P-channel FET, and said pull-down means comprises a N-channel FET.

5. The circuit of claim 3, wherein said delayed pull-up means includes an inverter for receiving the pull-up signal of the previous stage and for providing an inverted output being coupled to the gate of an N-channel FET, said inverter comprising a complementary pair N-channel FET, and a P-channel FET, and
said delayed pull-down means includes an inverter for receiving the pull-up signal of the previous stage and for providing an inverted output being coupled to the gate of an P-channel FET, said inverter comprising a complementary pair N-channel FET, and a P-channel FET.

6. The circuit of claim 1, wherein said stages comprise integrated circuits.

7. The circuit of claim 1 further comprising:
   means for accelerated turn-off of said pull-up means comprising an inverter for providing an inverted first input signal to said pull-up means; and
   means for accelerated turn-off of said pull-down means comprising an inverter for providing an inverted second input signal to said pull-down means.

8. The circuit of claim 7, wherein said means for providing an accelerated pull-up signal comprises a P-channel FET, and said means for providing an accelerated pull-down signal comprises an N-channel FET.

* * * * *